(12) United States Patent
Zuo

(10) Patent No.: US 11,456,270 B2
(45) Date of Patent: Sep. 27, 2022

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Mingxing Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,200

(22) Filed: Jan. 18, 2022

(65) Prior Publication Data

US 2022/0271000 A1 Aug. 25, 2022

Related U.S. Application Data

(63) Continuation of application No. PCT/CN2021/112029, filed on Aug. 11, 2021.

(30) Foreign Application Priority Data

Feb. 25, 2021 (CN) .......................... 202110212890.2

(51) Int. Cl.
*H01L 23/00* (2006.01)
*H01L 25/065* (2006.01)

(52) U.S. Cl.
CPC .............. *H01L 24/32* (2013.01); *H01L 24/27* (2013.01); *H01L 24/29* (2013.01); *H01L 24/83* (2013.01);
(Continued)

(58) Field of Classification Search
CPC ..................... H01L 24/27; H01L 24/28; H01L 2224/27011; H01L 2224/48225; H01L 2924/3512
See application file for complete search history.

(56) References Cited

U.S. PATENT DOCUMENTS 8,106,495 B2 * 1/2012 Kajiki .................. H01L 21/565
257/E23.18
9,570,632 B2 2/2017 Miyake
(Continued)

FOREIGN PATENT DOCUMENTS

CN 205282469 U 6/2016
CN 104425632 B 4/2017
(Continued)

OTHER PUBLICATIONS

International Search Report and English Translation cited in PCT/CN2021/112029 dated Dec. 3, 2021, 9 pages.
(Continued)

*Primary Examiner* — Jasmine J Clark
(74) *Attorney, Agent, or Firm* — Cooper Legal Group, LLC

(57) ABSTRACT

The present disclosure provides a semiconductor structure and a manufacturing method thereof. The semiconductor structure includes a substrate, a die and a first adhesive layer; a surface of the substrate is provided with an insulation layer; the die is arranged on a surface of the insulation layer via the first adhesive layer; the insulation layer is provided with at least one slot; a position of the at least one slot corresponds to at least a part of an edge of the first adhesive layer; a second adhesive layer is arranged in the at least one slot; at least a part of a surface of the second adhesive layer is connected with the first adhesive layer; and an elasticity modulus of the second adhesive layer is smaller than an elasticity modulus of the first adhesive layer.

19 Claims, 7 Drawing Sheets

(52) U.S. Cl.
CPC ............. *H01L 24/33* (2013.01); *H01L 24/48* (2013.01); *H01L 25/0657* (2013.01); *H01L 2224/27011* (2013.01); *H01L 2224/27622* (2013.01); *H01L 2224/29011* (2013.01); *H01L 2224/29013* (2013.01); *H01L 2224/29691* (2013.01); *H01L 2224/32225* (2013.01); *H01L 2224/33181* (2013.01); *H01L 2224/48225* (2013.01); *H01L 2924/3512* (2013.01)

(56) References Cited

U.S. PATENT DOCUMENTS

| | | |
|---|---|---|
| 9,578,744 B2 | 2/2017 | Talledo et al. |
| 2013/0153269 A1* | 6/2013 | Takahashi ............ H05K 3/368 |
| | | 174/250 |

FOREIGN PATENT DOCUMENTS

| | | |
|---|---|---|
| CN | 206532771 U | 9/2017 |
| CN | 206532773 U | 9/2017 |
| CN | 208819882 U | 5/2019 |
| CN | 111312666 A | 6/2020 |
| JP | 2006173416 A | 6/2006 |

OTHER PUBLICATIONS

Written Opinion and English Translation cited in PCT/CN2021/112029 dated Dec. 3, 2021, 7 pages.

* cited by examiner

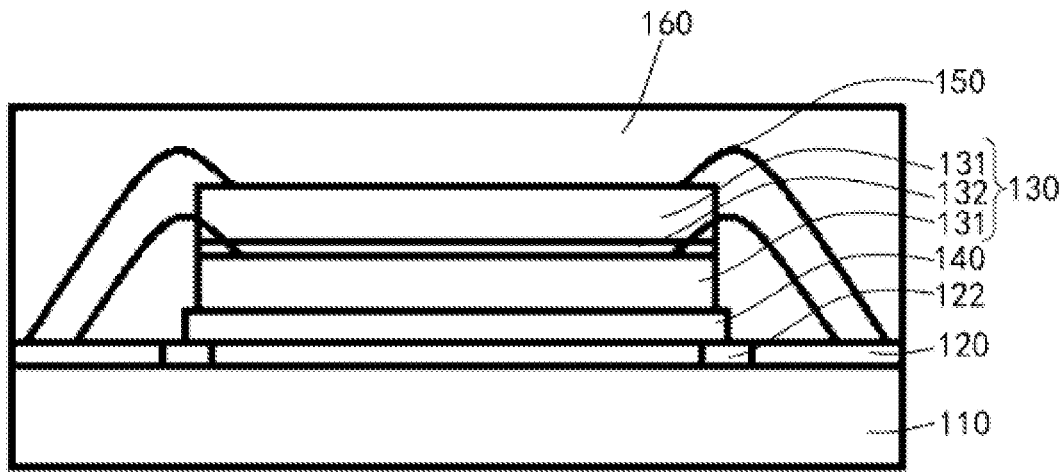

FIG. 14

| Providing a substrate, wherein a surface of the substrate is provided with an insulation layer | S100 |

| Forming at least one hole slot which runs through the insulation layer on the insulation layer | S101 |

| Forming a second adhesive layer in the at least one hole slot | S102 |

| Arranging a die on a surface of the insulation layer via a first adhesive layer, wherein a position of the at least one hole slot corresponds to at least a part of an edge of the first adhesive layer, at least a part of a surface of the second adhesive layer is connected with the first adhesive layer, and an elasticity modulus of the second adhesive layer is smaller than an elasticity modulus of the first adhesive layer | S103 |

| Forming a packaging layer on the surface of the insulation layer, wherein the die and the first adhesive layer are packaged in the packaging layer | S104 |

FIG. 15

SEMICONDUCTOR STRUCTURE AND MANUFACTURING METHOD THEREOF

CROSS-REFERENCE TO RELATED APPLICATIONS

This is a continuation of International Application PCT/CN2021/112029, filed on Aug. 11, 2021, which claims the priority to Chinese Patent Application No. 202110212890.2, titled "SEMICONDUCTOR STRUCTURE AND MANUFACTURING METHOD THEREOF" and filed on Feb. 25, 2021. The entire contents of International Application PCT/CN2021/112029 and Chinese Patent Application No. 202110212890.2 are incorporated herein by reference.

TECHNICAL FIELD

The present disclosure relates to the technical field of semiconductors, and in particular to a semiconductor structure and a manufacturing method thereof.

BACKGROUND

In the packaging process of an existing memory thin die stack, a die, an adhesive layer and a solder mask (SR for short, alias "green mask") on a substrate are in direct contact with each other. In the art, the substrate (including the solder mask) and the die are designed thinner and thinner. When the die bends itself, or deforms due to external force, or undergoes temperature cycling reliability (TC reliability) detection, an edge position where the die is connected with the substrate is prone to die crack or substrate crack due to stress concentration.

SUMMARY

One aspect of the embodiments of the present disclosure provides a semiconductor structure, including a substrate, a die and a first adhesive layer, wherein a surface of the substrate is provided with an insulation layer; the die is arranged on a surface of the insulation layer via the first adhesive layer; the insulation layer is provided with at least one slot; a position of the at least one slot corresponds to at least a part of an edge of the first adhesive layer; a second adhesive layer is arranged in the at least one slot; at least a part of a surface of the second adhesive layer is connected with the first adhesive layer; and an elasticity modulus of the second adhesive layer is smaller than an elasticity modulus of the first adhesive layer.

Another aspect of the embodiments of the present disclosure provides a method of manufacturing a semiconductor structure, including: providing a substrate, wherein a surface of the substrate is provided with an insulation layer; forming at least one slot which runs through the insulation layer on the insulation layer; forming a second adhesive layer in the at least one slot; arranging a die on a surface of the insulation layer via a first adhesive layer, wherein a position of the at least one slot corresponds to at least a part of an edge of the first adhesive layer, at least a part of a surface of the second adhesive layer is connected with the first adhesive layer; and an elasticity modulus of the second adhesive layer is smaller than an elasticity modulus of the first adhesive layer; and forming a packaging layer on the surface of the insulation layer, wherein the die and the first adhesive layer are packaged in the packaging layer.

BRIEF DESCRIPTION OF THE DRAWINGS

FIG. 14 is a schematic structure of a semiconductor structure according to another exemplary embodiment;

FIG. 15 shows a flowchart of a method of manufacturing a semiconductor structure according to an exemplary embodiment;

DETAILED DESCRIPTION

Figure 1:
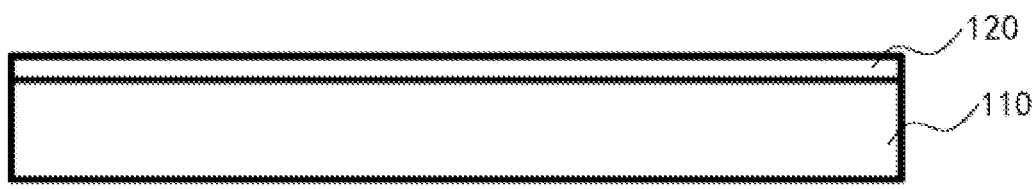
FIGS. 1-4 are schematic structures of a semiconductor structure in a plurality of steps of a method of manufacturing a semiconductor structure according to an exemplary embodiment.

Exemplary embodiments will be described below more comprehensively with reference to the accompanying drawings. However, the exemplary embodiments can be implemented in a plurality of forms and should not be construed as being limited to embodiments described herein. On the contrary, these embodiments are provided such that the present disclosure is more comprehensive and complete, and fully conveys the concept of the exemplary embodiments to those skilled in the art. The same reference numerals in the figures indicate the same or similar structures, and thus their detailed descriptions will be omitted.

Figure 11:
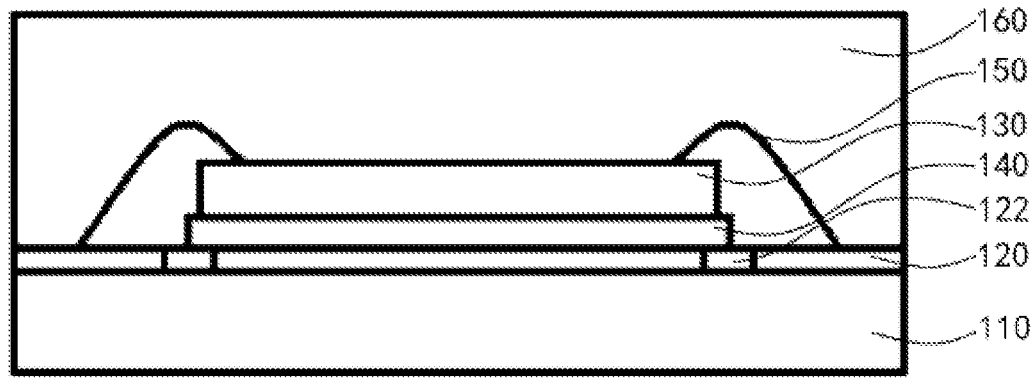

Referring to FIG. 11, FIG. 11 representatively shows a schematic structure of a semiconductor structure proposed by the present disclosure. In the exemplary embodiment, the semiconductor structure proposed by the present disclosure is described by taking its application to a packaging structure of a memory thin die stack as an example. It is understandable for those skilled in the art that, in order to apply the relevant design of the present disclosure to other types of semiconductor structures, various modifications, additions, substitutions, deletions or other changes may be made to the following specific embodiments, but such changes are still within the scope of the principle of the semiconductor structure proposed by the present disclosure.

As shown in FIG. 11, in the embodiment, the semiconductor structure proposed by the present disclosure mainly includes a substrate 110, a die 130 and a first adhesive layer 140. Specifically, a surface of the substrate 110 is provided with an insulation layer 120. The die 130 is arranged on a surface of the insulation layer 120 via the first adhesive layer 140. The insulation layer 120 is provided with at least one slot 121, and a position of the at least one slot 121 corresponds to an edge of the first adhesive layer 140. And, a second adhesive layer 122 is arranged in the at least one slot 121, and at least a part of a surface of the second adhesive layer 122 is connected with the first adhesive layer 140. On this basis, an elasticity modulus of the second adhesive layer 122 is smaller than an elasticity modulus of the first adhesive layer 140. Via the above design, the semiconductor structure proposed by the present disclosure can optimize the stress distribution of an edge where the die 130 is connected with the substrate 110 (including the insulation layer 120 arranged on the surface of the substrate 110), such that the semiconductor structure is difficult to generate crack at the edge where the die 130 is connected with the substrate 110 during bending or deformation.

Optionally, referring to FIG. 11, in the embodiment, the at least one slot 121 may run through the insulation layer 120. In other embodiments, the at least one slot 121 may also not run through the insulation layer 120, for example, the at least one slot 121 is only opened on an upper surface of the insulation layer 120.

Figure 5:
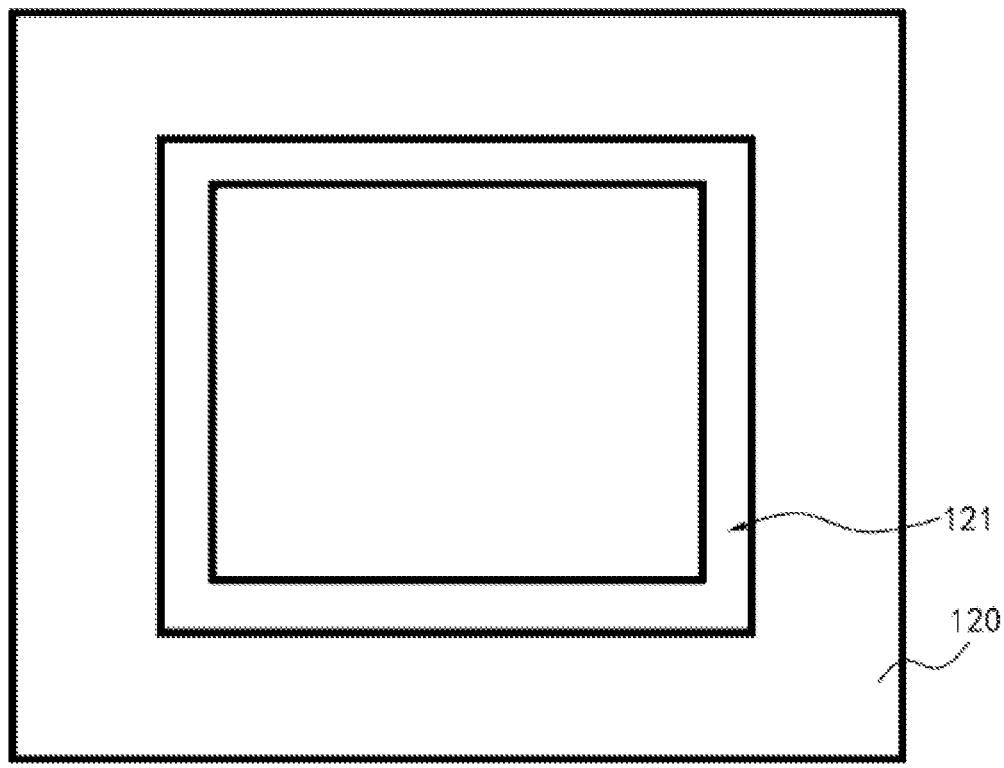
FIG. 5 is a top view of the semiconductor structure in steps as shown in FIG. 4.

Optionally, referring to FIG. 5, FIG. 5 representatively shows a top view of the semiconductor structure in forming the at least one slot 121, and in the embodiment, one slot of the at least one slot 121 may approximately be an annular closed structure, such that the slot of the at least one slot 121 corresponds to the whole edge of the first adhesive layer 140. Via the above design, the semiconductor structure proposed by the present disclosure can optimize the stress distribution of the whole position of the edge where the die 130 is connected with the substrate 110, such that the whole edge where the die 130 is connected with the substrate 110 is difficult to generate crack.

Further, referring to FIG. 5, based on the design that the slot of the at least one slot 121 is an annular closed structure, in the embodiment, the first adhesive layer 140 may be approximately rectangular and the edge of the first adhesive layer 140 has four side edges. On this basis, the slot of the at least one slot 121 may be approximately arranged in a form of a rectangular ring. In other embodiments, based on the design that the slot of the at least one slot 121 corresponds to the whole edge of the first adhesive layer 140, when the first adhesive layer 140 is in a shape of a circle, a triangle, a trapezoid or the like, the slot of the at least one slot 121 may be arranged in corresponding forms of a circular ring, a triangular ring, a trapezoidal ring and the like, which is not limited to the embodiment.

Optionally, as shown in FIG. 11, in the embodiment, on the surface of the substrate 110, an outer side edge of an orthographic projection figure of the at least one slot 121 may be located outside an edge of an orthographic projection figure of the first adhesive layer 140. Accordingly, the second adhesive layer 122 arranged in the at least one slot 121 can extend to an outer side of the edge of the first adhesive layer 140, such that the present disclosure can optimize the stress distribution of a part of a region, located on the outer side of the edge of the first adhesive layer 140, of the substrate 110, thereby further preventing crack of a relevant region.

Figure 9:
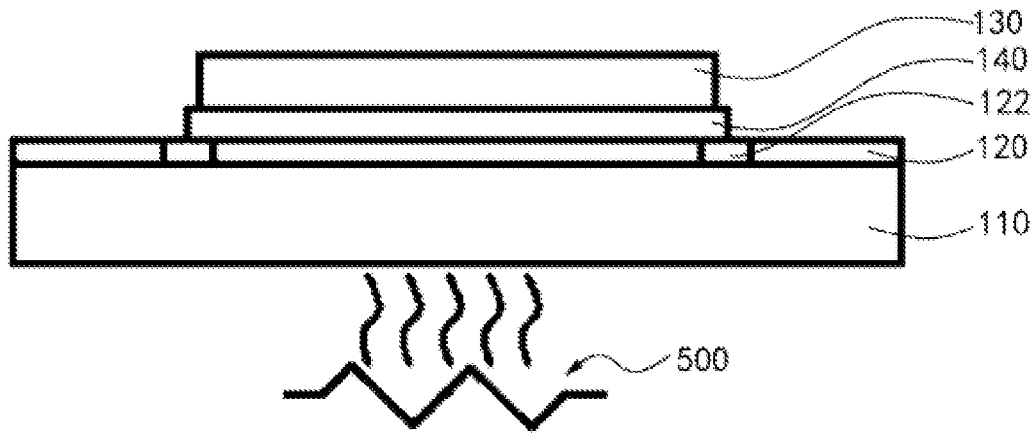

Optionally, referring to FIG. 9, FIG. 9 representatively shows a schematic structure of the semiconductor structure in arranging the die 130, and in the embodiment, a notch width d1 of the at least one slot 121 may be 5%-10% of a width d2 of the first adhesive layer 140, for example, 5%, 6.5%, 8% and 10%. Accordingly, the present disclosure selects a width proportion of the slot 121 to the first adhesive layer 140 as a reasonable scope, thereby preventing the die 130 from overall viscosity inefficiency due to excessive notch width d1 of the at least one slot 121, and preventing the condition that the effects of better stress distribution optimization and crack prevention cannot be realized due to too small notch width d1 when the semiconductor structure deforms. In other embodiments, the notch width d1 of the at least one slot 121 may be smaller than 5% or greater than 10% of the width d2 of the first adhesive layer 140, for example, 4.5%, 11% and the like, which is not limited to the embodiment.

Optionally, in the embodiment, the elasticity modulus of the second adhesive layer 122 may be smaller than the elasticity modulus of the insulation layer 120. Accordingly, a corresponding position (for example, a position adjoining the at least one slot 121, namely, a position corresponding to the edge of the first adhesive layer 140) of the insulation layer 120 may be difficult to generate crack. In other embodiments, on the basis of ensuring that the elasticity modulus of the second adhesive layer 122 is smaller than the elasticity modulus of the first adhesive layer 140, the elasticity modulus of the second adhesive layer 122 may also be equal to or greater than the elasticity modulus of the insulation layer 120, which is not limited to the embodiment.

Optionally, in the embodiment, the elasticity modulus of the second adhesive layer 122 may be smaller than the elasticity modulus of the die 130. Accordingly, a corresponding position (for example, an edge position) of the die 130 may be difficult to generate crack. In other embodiments, on the basis of ensuring that the elasticity modulus of the second adhesive layer 122 is smaller than the elasticity modulus of the first adhesive layer 140, the elasticity modulus of the second adhesive layer 122 may also be equal to or greater than the elasticity modulus of the die 130, which is not limited to the embodiment.

Optionally, in the embodiment, a coefficient of thermal expansion of the second adhesive layer 122 may be smaller than a coefficient of thermal expansion of the first adhesive layer 140. Accordingly, when the semiconductor structure is heated to deform, as the second adhesive layer 122 has a lower coefficient of thermal expansion relative to the first adhesive layer 140, the first adhesive layer 140 can be prevented from crack caused by generating, by the second adhesive layer, same or even larger expansive deformation as the first adhesive layer 140. In other embodiments, under the premise of ensuring that the present disclosure optimizes the stress distribution of a relevant position via the arrangement of the second adhesive layer 122, the coefficient of thermal expansion of the second adhesive layer 122 may also be greater than or equal to the coefficient of thermal expansion of the first adhesive layer 140, which is not limited to the embodiment.

Further, based on the design that the coefficient of thermal expansion of the second adhesive layer 122 is smaller than the coefficient of thermal expansion of the first adhesive layer 140, in the embodiment, the coefficient of thermal expansion of the second adhesive layer 122 may also be smaller than the coefficient of thermal expansion of the insulation layer 120. Accordingly, when the semiconductor structure is heated to deform, as the second adhesive layer 122 has a lower coefficient of thermal expansion relative to the insulation layer 120, the insulation layer 120 may be prevented from crack caused by generating, by the second adhesive layer 122, same or even larger expansive deformation as the insulation layer 120. In other embodiments, on the basis that the coefficient of thermal expansion of the second adhesive layer 122 is smaller than the coefficient of thermal expansion of the first adhesive layer 140, the coefficient of thermal expansion of the second adhesive layer 122 may also be greater than or equal to the coefficient of thermal expansion of the insulation layer 120, which is not limited to the embodiment.

Further, based on the design that the coefficient of thermal expansion of the second adhesive layer 122 is smaller than the coefficient of thermal expansion of the first adhesive layer 140, in the embodiment, the coefficient of thermal expansion of the second adhesive layer 122 may also be smaller than the coefficient of thermal expansion of the die 130. Accordingly, when the semiconductor structure is heated to deform, as the second adhesive layer 122 has a lower coefficient of thermal expansion relative to the die 130, the die 130 may be prevented from crack caused by generating, by the second adhesive layer, same or even larger expansive deformation as the die 130. In other embodiments, on the basis that the coefficient of thermal expansion of the second adhesive layer 122 is smaller than the coefficient of thermal expansion of the first adhesive layer 140, the coefficient of thermal expansion of the second adhesive layer 122 may also be greater than or equal to the coefficient of thermal expansion of the die 130, which is not limited to the embodiment.

Optionally, in the embodiment, a bonding strength between the first adhesive layer 140 and the second adhesive layer 122 may be smaller than a bonding strength between the first adhesive layer 140 and the die 130. Accordingly, when the semiconductor structure deforms, by utilizing the above bonding strength design, the separation of the second adhesive layer 122 from the first adhesive layer 140 may be earlier than the separation of the first adhesive layer 140 from the die 130, therefore, when the deformation is too large to generate thin film structure separation, the separation of the second adhesive layer 122 from the first adhesive layer 140 can be utilized to prevent or slow down the separation of the first adhesive layer 140 from the die 130. In other embodiments, under the premise of ensuring that the present disclosure optimizes the stress distribution of a relevant position via the arrangement of the second adhesive layer 122, the bonding strength between the first adhesive layer 140 and the second adhesive layer 122 may also be greater than or equal to the bonding strength between the first adhesive layer 140 and the die 130, which is not limited to the embodiment.

Optionally, in the embodiment, the bonding strength between the first adhesive layer 140 and the second adhesive layer 122 may be smaller than a bonding strength between the first adhesive layer 140 and the insulation layer 120. Accordingly, when the semiconductor structure deforms, by utilizing the above bonding strength design, the separation of the second adhesive layer 122 from the first adhesive layer 140 may be earlier than the separation of the first adhesive layer 140 from the insulation layer 120, therefore, when the deformation is too large to generate thin film structure separation, the separation of the second adhesive layer 122 from the first adhesive layer 140 can be utilized to prevent or slow down the separation of the first adhesive layer 140 from the insulation layer 120. In other embodiments, under the premise of ensuring that the present disclosure optimizes the stress distribution of the relevant position via the arrangement of the second adhesive layer 122, the bonding strength between the first adhesive layer 140 and the second adhesive layer 122 may also be greater than or equal to the bonding strength between the first adhesive layer 140 and the insulation layer 120, which is not limited to the embodiment.

Optionally, in the embodiment, the material of the second adhesive layer 122 may include silicone gel, epoxy resin adhesive (for example, organosilicon epoxy resin adhesive, Silicon epoxy) and the like.

Based on the above detailed description of the first embodiment of the semiconductor structure proposed by the present disclosure, a second embodiment of the semiconductor structure proposed by the present disclosure will be described below in combination with FIG. 12.

Figure 12:
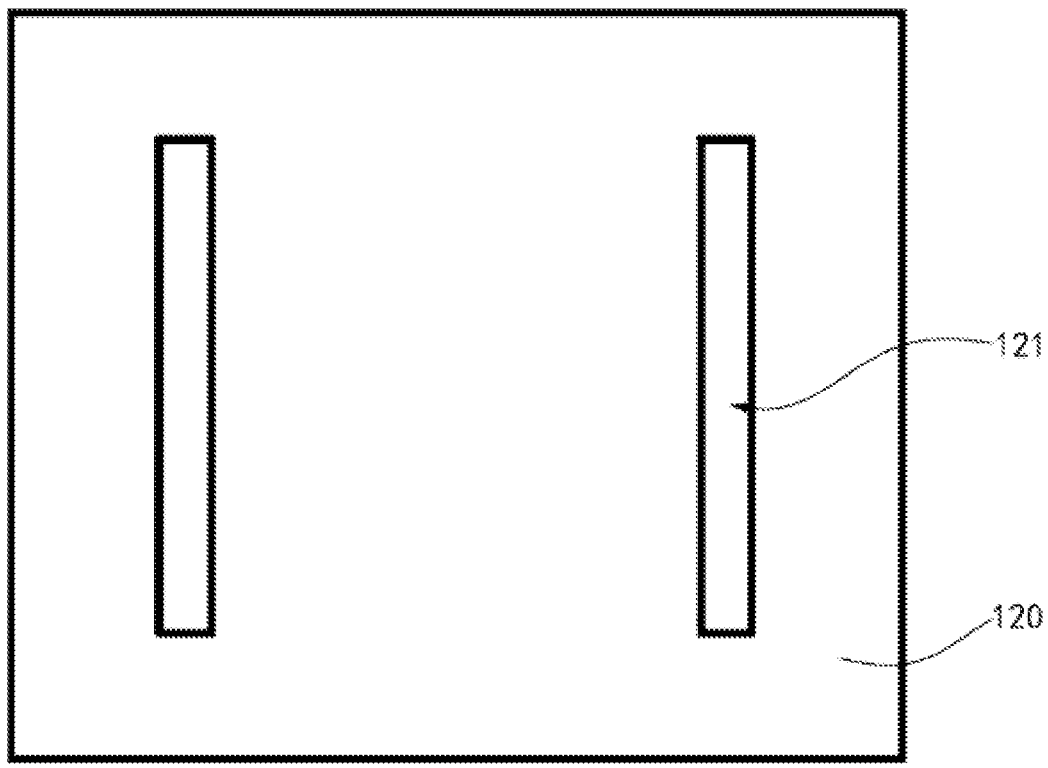
FIG. 12 is a top view of a semiconductor structure in one step of a method of manufacturing a semiconductor structure according to another exemplary embodiment.

Referring to FIG. 12, FIG. 12 representatively shows a top view of the semiconductor structure in forming the at least one slot 121 in the second embodiment. In the second embodiment, the semiconductor structure proposed by the present disclosure adopts a design approximately same as a design of the first embodiment described above, and the design of the second embodiment different from the design of the first embodiment will be described below.

As shown in FIG. 12, in the embodiment, the position of the at least one slot 121 corresponds to a part of the edge of the first adhesive layer 140. Accordingly, the present disclosure can optimize the stress distribution of a part of the position of the edge where the die 130 is connected with the substrate 110, such that a part of the edge where the die 130 is connected with the substrate 110 is difficult to generate crack. In other words, in various possible embodiments consistent with the design concept of the semiconductor structure proposed by the present disclosure, the position of the at least one slot 121 may correspond to at least a part of the edge of the first adhesive layer 140, such that the present disclosure can optimize the stress distribution of at least a part of the position of the edge where the die 130 is connected with the substrate 110.

Optionally, as shown in FIG. 12, based on the design that the position of the at least one slot 121 corresponds to a part of the edge of the first adhesive layer 140, in the embodiment, when the first adhesive layer 140 is approximately rectangular, the at least one slot 121 corresponds to one, two or three side edges of the rectangle. Certainly, the at least one slot 121 may also correspond to a part of any side edge, or the at least one slot 121 may also correspond to four corner parts of the rectangle, separately, both of which are not limited to the embodiment.

Based on the above detailed description of the first embodiment of the semiconductor structure proposed by the present disclosure, a third embodiment of the semiconductor structure proposed by the present disclosure will be described below in combination with FIG. 13.

Figure 13:
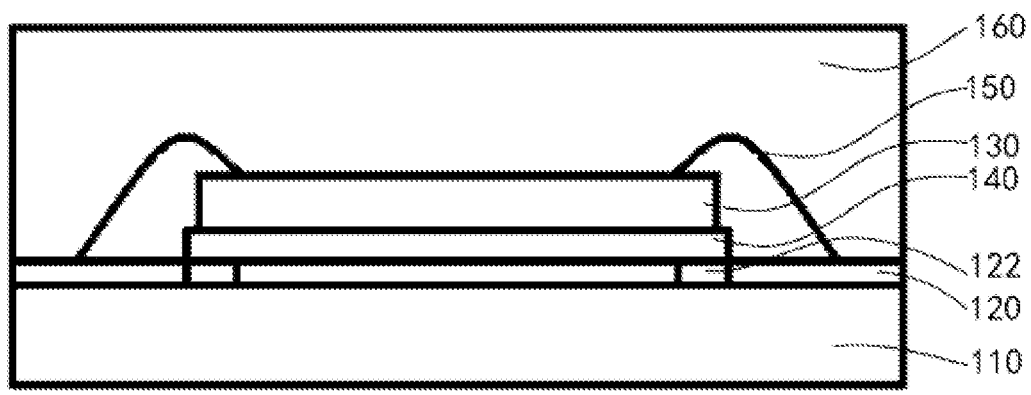
FIG. 13 is a schematic structure of a semiconductor structure according to another exemplary embodiment.

Referring to FIG. 13, FIG. 13 representatively shows a schematic structure of the semiconductor structure in the third embodiment. In the third embodiment, the semiconductor structure proposed by the present disclosure adopts a design approximately same as a design of the first embodiment described above, and the design of the third embodiment different from the design of the first embodiment will be described below.

As shown in FIG. 13, in the embodiment, on the surface of the substrate 110, an orthographic projection figure of the at least one slot 121 is fully covered by an orthographic projection figure of the first adhesive layer 140, such that the whole top surface of the second adhesive layer 122 is connected with the first adhesive layer 140. In other words, in various possible embodiments consistent with the design concept of the semiconductor structure proposed by the present disclosure, at least a part of the surface of the second adhesive layer 122 is connected with the first adhesive layer 140.

Further, as shown in FIG. 13, based on the design that the orthographic projection figure of the at least one slot 121 is fully covered by the orthographic projection figure of the first adhesive layer 140, on the surface of the substrate 110, an outer side edge of the orthographic projection figure of the at least one slot 121 may coincide with an edge of the orthographic projection figure of the first adhesive layer 140.

Based on the above detailed description of the first embodiment of the semiconductor structure proposed by the present disclosure, a fourth embodiment of the semiconductor structure proposed by the present disclosure will be described below in combination with FIG. 14.

Referring to FIG. 14, FIG. 14 representatively shows a schematic structure of the semiconductor structure in the fourth embodiment. In the fourth embodiment, the semiconductor structure proposed by the present disclosure adopts a design approximately same as a design of the first embodiment described above, and the design of the fourth embodiment different from the design of the first embodiment will be described below.

As shown in FIG. 14, in the embodiment, the die 130 may adopt a multilayer stack structure, namely, the die includes a plurality of bare dies 131 of an alternate stack and a die attach film 132 (DAF for short). On this basis, the die 130 is still arranged on the first adhesive layer 140 as an integral structure, and specifically, the bare die 131 located at the lowest layer is arranged on the first adhesive layer 140.

For example, the semiconductor structure proposed by the present disclosure may include a packaging layer 160, which is arranged on a surface of the substrate and internally packages the die 130 and the first adhesive layer 140.

For another example, the bare die 131 of the die 130 is bonded with the substrate 110 via a bonding wire 150.

Based on the above detailed description of several exemplary embodiments of the semiconductor structure proposed by the present disclosure, an exemplary embodiment of a method of manufacturing the semiconductor structure proposed by the present disclosure will be described below in combination with FIGS. 1-11.

Referring to FIGS. 1 to 11, FIGS. 1-4 and FIGS. 6-11 representatively show schematic structures of the semiconductor structure in a plurality of steps of the method of manufacturing the semiconductor structure proposed by the present disclosure, respectively. In the exemplary embodiment, the method of manufacturing the semiconductor structure proposed by the present disclosure is described by taking the method of manufacturing the packaging structure applied to a memory thin die stack as an example. It is understandable for those skilled in the art that, in order to apply the relevant design of the present disclosure to other types of semiconductor structures, various modifications, additions, substitutions, deletions or other changes may be made to the following specific embodiments, but such changes are still within the scope of the principle of the method of manufacturing the semiconductor structure proposed by the present disclosure.

As shown in FIGS. 1-11, referring to FIG. 15, in the embodiment, the method of manufacturing the semiconductor structure proposed by the present disclosure mainly includes:

S100: providing a substrate 110, wherein a surface of the substrate 110 is provided with an insulation layer 120;

S101: forming at least one slot 121 which runs through the insulation layer 120 on the insulation layer 120;

S102: forming a second adhesive layer 122 in the at least one slot 121;

S103: arranging a die 130 on a surface of the insulation layer 120 via a first adhesive layer 140, wherein a position of the at least one slot 121 corresponds to at least a part of an edge of the first adhesive layer 140, at least a part of a surface of the second adhesive layer 122 is connected with the first adhesive layer 140, and an elasticity modulus of the second adhesive layer 122 is smaller than an elasticity modulus of the first adhesive layer 140; and S104: forming a packaging layer 160 on the surface of the substrate 110, wherein each structure on the substrate 110 is internally packaged in the packaging layer 160.

Via the above design, the method of manufacturing the semiconductor structure proposed by the present disclosure can optimize the stress distribution of an edge where the die 130 is connected with the substrate 110 (including the insulation layer 120 arranged on the surface of the substrate 110), such that the semiconductor structure is difficult to generate crack at the edge where the die 130 is connected with the substrate 110 during bending or deformation.

As shown in FIG. 1, FIG. 1 representatively shows a schematic structure of the semiconductor structure in the "providing a substrate 110". In the above step, the semiconductor structure includes the substrate 110 and the insulation layer 120. The insulation layer 120 is arranged on a surface of the substrate 110. It is understandable that in some of the description of the Description, the insulation layer 120 is overall described as a part of the substrate 110, and in a practical process, a finished substrate having the insulation layer 120 can be directly manufactured without departing from the relevant design concept of the present disclosure.

Figure 2:
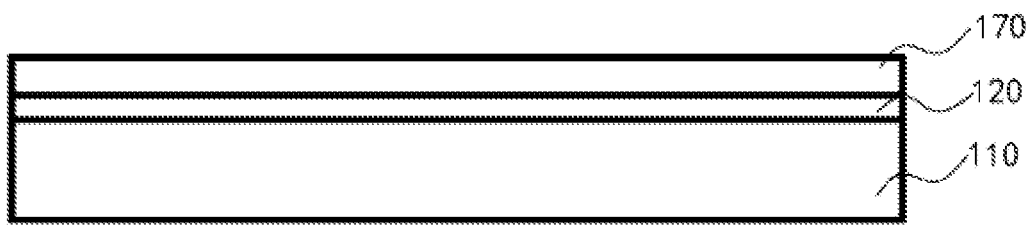
Figure 3:
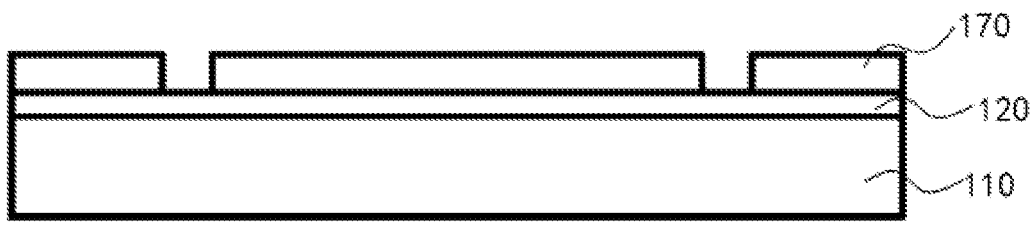
Figure 4:
Figure 16:
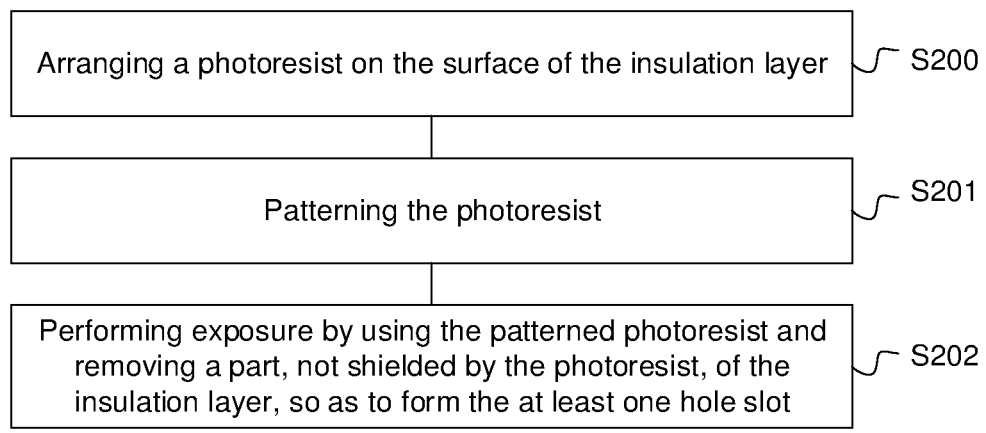
FIG. 16 shows a flowchart of forming at least one slot in a method of manufacturing a semiconductor structure according to an exemplary embodiment.

Optionally, as shown in FIGS. 2-4, referring to FIG. 16, in the embodiment, the forming the at least one slot 121 may specifically include:

S200: arranging a photoresist 170 on the surface of the insulation layer 120;

S201: patterning the photoresist 170; and

S202: performing exposure by using the patterned photoresist 170 and removing a part, not shielded by the photoresist 170, of the insulation layer 120, so as to form the at least one slot 121.

As shown in FIG. 2, FIG. 2 representatively shows a schematic structure of the semiconductor structure in the "arranging the photoresist 170". In the above step, the semiconductor structure includes the substrate 110, the insulation layer 120 and the photoresist 170. The photoresist 170 is coated on the surface of the insulation layer 120.

As shown in FIG. 3, FIG. 3 representatively shows a schematic structure of the semiconductor structure in the "patterning the photoresist 170". In the above step, the semiconductor structure includes the substrate 110, the insulation layer 120 and the patterned photoresist 170. The part, removed via the patterning process, of the photoresist 170 corresponds to a position, needing to arrange the at least one slot 121, on the insulation layer 120.

As shown in FIG. 4, FIG. 4 representatively shows a schematic structure of the semiconductor structure in the "performing exposure by using the photoresist 170 to remove a part of the insulation layer 120". In the above step, the semiconductor structure includes the substrate 110 and the remaining insulation layer 120 after the part is removed. The part, not shielded by the photoresist 170, of the insulation layer 120 is removed to form the at least one slot 121 which runs through the insulation layer 120, and so far, a process of transferring a pattern of the photoresist 170 onto the insulation layer 120 is finished.

As shown in FIG. 5, FIG. 5 representatively shows a top view of the semiconductor structure in the "performing exposure by using the photoresist 170 to remove a part of the insulation layer 120". The embodiment is described by taking the slot of the at least one slot 121 approximately being an annular closed structure, namely, the slot of the at least one slot 121 corresponding to the whole edge of the die 130 (the first adhesive layer 140) as an example, therefore, in order to ensure that the slot of the at least one slot 121 is approximately arranged in a form of a rectangle as shown in FIG. 5, a patterned opening of the photoresist 170 may also be approximately rectangular. In other embodiments, when the at least one slot 121 in other arrangement forms needs to be formed, for example, the arrangement form of the slots of the at least one slot 121 as shown in FIG. 12, the patterned opening of the photoresist 170 may also be correspondingly adjusted, which is not limited to the embodiment.

Figure 6:
FIGS. 6-11 are schematic structures of a semiconductor structure in a plurality of steps of a method of manufacturing a semiconductor structure according to an exemplary embodiment.
Figure 7:
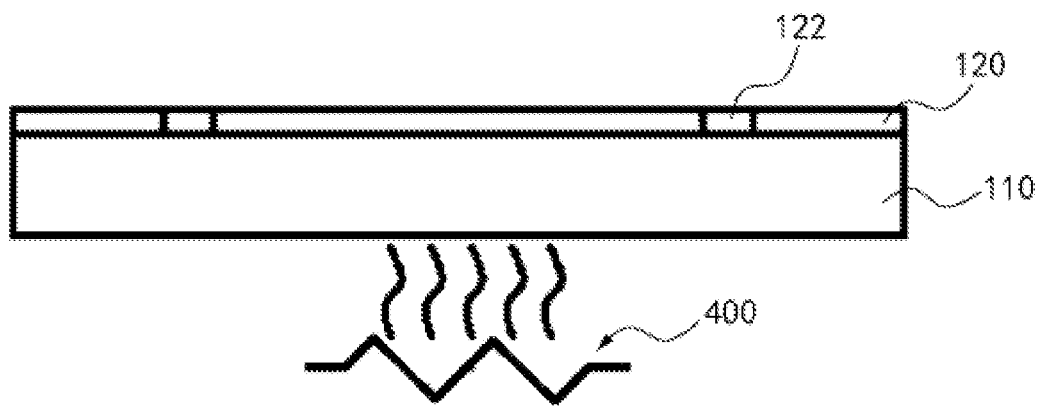
Figure 17:
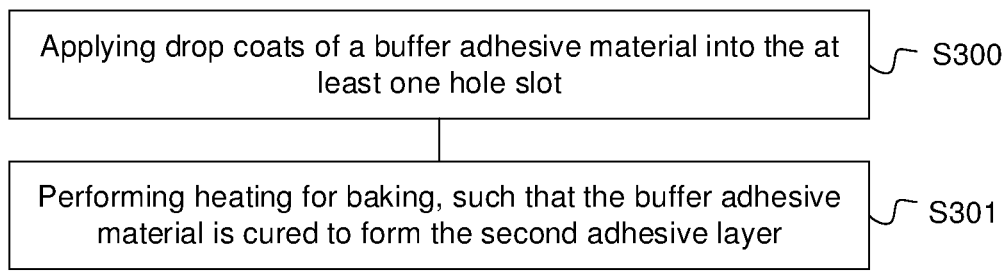
FIG. 17 shows a flowchart of forming a second adhesive layer in a method of manufacturing a semiconductor structure according to an exemplary embodiment.

Optionally, as shown in FIGS. 6 and 7, referring to FIG. 17, in the embodiment, the forming the second adhesive layer 122 may specifically include:

S300: applying drop coats of a buffer adhesive material into the at least one slot 121; and S301: performing heating for baking, such that the buffer adhesive material is cured to form the second adhesive layer 122.

As shown in FIG. 6, FIG. 6 representatively shows a schematic structure of the semiconductor structure in the "applying drop coats of a buffer adhesive material into the at least one slot 121". In the above step, the semiconductor structure includes the substrate 110, the insulation layer 120 and the buffer adhesive material, the drop coats of the buffer adhesive material are being applied into the at least one slot 121 of the insulation layer 120. The buffer adhesive material may be filled in the at least one slot 121 in a drop coat applying manner via an adhesive coating device 300, so as to ensure that the at least one slot 121 may be sufficiently filled and to optimize the material uniformity and compactness of the second adhesive layer 122 formed by a subsequent process, thereby further improving the effect of optimizing the stress distribution. In other embodiments, the buffer adhesive material may also be filled in the at least one slot 121 in other coating manners, which is not limited to the embodiment.

As shown in FIG. 7, FIG. 7 representatively shows a schematic structure of the semiconductor structure in the "performing heating for baking, such that the buffer adhesive material is cured to form the second adhesive layer 122". In the above step, the semiconductor structure includes the substrate 110, the insulation layer 120 and the cured second adhesive layer 122. The second adhesive layer 122 is formed via heating and curing the buffer adhesive material filled in the at least one slot 121 by a heating device 400. The heating device 400 may be, for example, an oven and the like.

Figure 8:
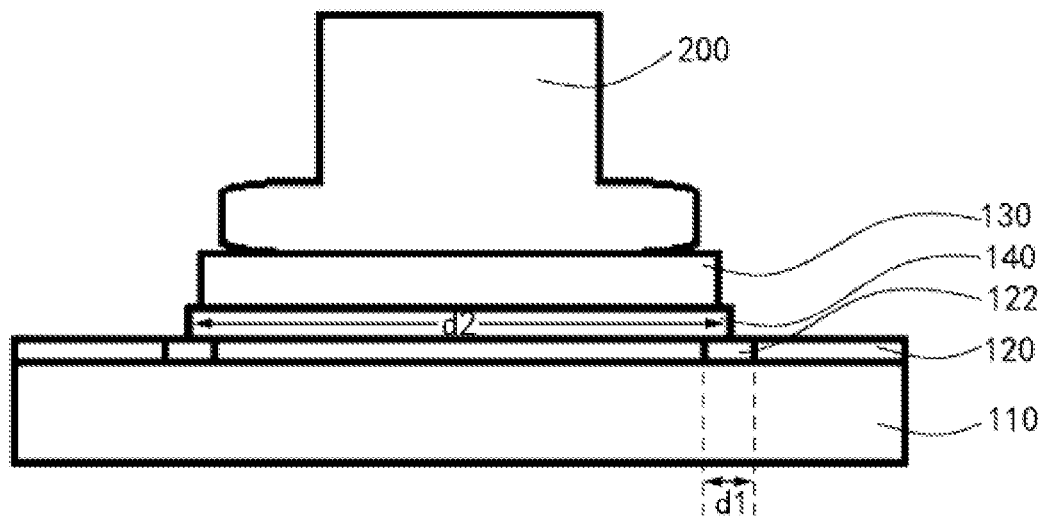

Optionally, as shown in FIGS. 8 and 9, in the embodiment, the arrangement of the die 130 may specifically include:

laminating the first adhesive layer 140 and the die 130 on the substrate 110; and performing heating for baking, such that the first adhesive layer 140 is cemented between the die 130 and the substrate 110.

As shown in FIG. 8, FIG. 8 representatively shows a schematic structure of the semiconductor structure in the "laminating the first adhesive layer 140 and the die 130 on the substrate 110". In the above step, the semiconductor structure includes the substrate 110, the insulation layer 120, the second adhesive layer 122, the first adhesive layer 140 and the die 130. The first adhesive layer 140 is located on the surface of the insulation layer 120, the die 130 is located on the surface of the first adhesive layer 140, and the first adhesive layer 140 and the die 130 may be laminated on the surface of the substrate 110 (actually the insulation layer 120) via a pressing device 200.

As shown in FIG. 9, FIG. 9 representatively shows a schematic structure of the semiconductor structure in the "performing heating for baking, such that the first adhesive layer 140 is cemented between the die 130 and the substrate 110". In the above step, the semiconductor structure includes the substrate 110, the insulation layer 120, the second adhesive layer 122, the first adhesive layer 140 and the die 130. Via the heating of the heating device 500, the first adhesive layer 140 may cement the die 130 on the substrate 110.

Further, in the embodiment, for the "performing heating for baking, such that the buffer adhesive material is cured to form the second adhesive layer 122" and "performing heating for baking, such that the first adhesive layer 140 is cemented between the die 130 and the substrate 110", the heating device 400 and the heating device 500 in the above two steps may adopt a same heating device. On this basis, differed from the heating step of arranging the die 130 to cure the first adhesive layer 140, the performing heating for baking so as to cure and form the second adhesive layer 122 may also be understood as "pre-baking". Accordingly, via the "pre-baking", the second adhesive layer 122 can be formed via curing, and a loading device of the semiconductor structure can be pre-heated.

Figure 10:

As shown in FIG. 10, FIG. 10 representatively shows a schematic structure of the semiconductor structure in the "bonding the die 130 with the substrate 110". In the above step, the semiconductor structure includes the substrate 110, the insulation layer 120, the second adhesive layer 122, the first adhesive layer 140, the die 130 and a bonding wire 150. The bonding wire 150 is connected between the die 130 and the substrate 110 to realize the bonding between the die 130 and the substrate 110.

As shown in FIG. 11, FIG. 11 representatively shows a schematic structure of the semiconductor structure in the "forming a packaging layer 160 on the surface of the insulation layer 120". In the above step, the semiconductor structure includes the substrate 110, the insulation layer 120, the second adhesive layer 122, the first adhesive layer 140, the die 130, the bonding wire 150 and the packaging layer 160. The packaging layer 160 is formed on the surface of the substrate 110, and internally packages each structure on the substrate 110, such as the first adhesive layer 140, the second adhesive layer 122, the die 130, the bonding wire 150 and the like.

To sum up, by arranging the at least one slot corresponding to the position of at least a part of the edge of the first adhesive layer at the insulation layer and arranging the second adhesive layer having the elasticity modulus smaller than the elasticity modulus of the first adhesive layer in the at least one slot, the semiconductor structure and the method of manufacturing the semiconductor structure proposed by the present disclosure can optimize the stress distribution of the edge where the die is connected with the substrate, such that the semiconductor structure is difficult to generate crack at the edge where the die is connected with the substrate during bending or deformation.

The present disclosure is described above with reference to several typical embodiments. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A semiconductor structure, comprising a substrate, a die and a first adhesive layer, wherein a surface of the substrate is provided with an insulation layer; the die is arranged on a surface of the insulation layer via the first adhesive layer;
the insulation layer is provided with at least one slot; a position of the at least one slot corresponds to at least a part of an edge of the first adhesive layer; a second adhesive layer is arranged in the at least one slot; at least a part of a surface of the second adhesive layer is connected with the first adhesive layer; and
an elasticity modulus of the second adhesive layer is smaller than an elasticity modulus of the first adhesive layer.

2. The semiconductor structure according to claim 1, wherein the at least one slot runs through the insulation layer.

3. The semiconductor structure according to claim 1, wherein one slot of the at least one slot is an annular closed structure, such that the one slot of the at least one slot corresponds to a whole edge of the first adhesive layer.

4. The semiconductor structure according to claim 3, wherein the first adhesive layer is rectangular; the edge of the first adhesive layer has four side edges; and the one slot of the at least one slot is arranged in a form of a rectangular ring.

5. The semiconductor structure according to claim 1, wherein on the surface of the substrate, an outer side edge of an orthographic projection of the at least one slot is located outside an edge of an orthographic projection of the first adhesive layer.

6. The semiconductor structure according to claim 1, wherein on the surface of the substrate, an orthographic projection of the at least one slot is fully covered by an orthographic projection of the first adhesive layer, such that a whole top surface of the second adhesive layer is connected with the first adhesive layer.

7. The semiconductor structure according to claim 6, wherein on the surface of the substrate, an outer side edge of the orthographic projection of the at least one slot coincides with an edge of the orthographic projection of the first adhesive layer.

8. The semiconductor structure according to claim 1, wherein a notch width of the at least one slot is 5%-10% of a width of the first adhesive layer.

9. The semiconductor structure according to claim 1, wherein the elasticity modulus of the second adhesive layer is smaller than an elasticity modulus of the insulation layer.

10. The semiconductor structure according to claim 1, wherein the elasticity modulus of the second adhesive layer is smaller than an elasticity modulus of the die.

11. The semiconductor structure according to claim 1, wherein a coefficient of thermal expansion of the second adhesive layer is smaller than a coefficient of thermal expansion of the first adhesive layer.

12. The semiconductor structure according to claim 11, wherein the coefficient of thermal expansion of the second adhesive layer is smaller than a coefficient of thermal expansion of the insulation layer.

13. The semiconductor structure according to claim 11, wherein the coefficient of thermal expansion of the second adhesive layer is smaller than a coefficient of thermal expansion of the die.

14. The semiconductor structure according to claim 1, wherein a bonding strength between the first adhesive layer and the second adhesive layer is smaller than a bonding strength between the first adhesive layer and the die.

15. The semiconductor structure according to claim 1, wherein a bonding strength between the first adhesive layer and the second adhesive layer is smaller than a bonding strength between the first adhesive layer and the insulation layer.

16. The semiconductor structure according to claim 1, wherein a material of the second adhesive layer comprises silicone gel and epoxy resin adhesive.

17. A method of manufacturing a semiconductor structure, comprising:
providing a substrate, wherein a surface of the substrate is provided with an insulation layer;
forming at least one slot which runs through the insulation layer on the insulation layer;
forming a second adhesive layer in the at least one slot;
arranging a die on a surface of the insulation layer via a first adhesive layer, wherein a position of the at least one slot corresponds to at least a part of an edge of the first adhesive layer, at least a part of a surface of the second adhesive layer is connected with the first adhesive layer, and an elasticity modulus of the second adhesive layer is smaller than an elasticity modulus of the first adhesive layer; and
forming a packaging layer on the surface of the substrate, wherein each structure on the substrate is internally packaged in the packaging layer.

18. The method of manufacturing a semiconductor structure according to claim 17, wherein the forming the at least one slot comprises:
arranging a photoresist on the surface of the insulation layer;
patterning the photoresist; and
performing exposure by using the patterned photoresist and removing a part, not shielded by the patterned photoresist, of the insulation layer, so as to form the at least one slot.

19. The method of manufacturing a semiconductor structure according to claim 17, wherein the forming the second adhesive layer comprises:
applying drop coats of a buffer adhesive material into the at least one slot; and
performing heating for baking, such that the buffer adhesive material is cured to form the second adhesive layer.

* * * * *